United States Patent [19]

Brearley et al.

[11] Patent Number: 5,690,784
[45] Date of Patent: Nov. 25, 1997

[54] ION MILLING END POINT DETECTION METHOD AND APPARATUS

[75] Inventors: William Harrington Brearley, Poughkeepsie; Donald Charles Forslund; Douglas William Ormond, Jr., both of Wappingers Falls; Gerald Joseph Sliss, Poughkeepsie, all of N.Y.

[73] Assignee: International Business Machines Corporation, Armonk, N.Y.

[21] Appl. No.: 262,204

[22] Filed: Jun. 20, 1994

[51] Int. Cl.⁶ .................... H01L 21/306; G01N 21/00
[52] U.S. Cl. .................... 156/626.1; 156/345; 216/60; 204/298.32; 204/192.33
[58] Field of Search .................... 204/298.03, 298.32, 204/192.13, 192.33; 216/60, 61; 156/345, 626.1, 627.1

[56] References Cited

U.S. PATENT DOCUMENTS

| | | | |
|---|---|---|---|
| 3,507,248 | 4/1970 | Seeley et al. | 204/298.31 X |
| 4,207,137 | 6/1980 | Tretola | 156/627.1 |
| 4,245,154 | 1/1981 | Uehara et al. | 250/227 |
| 4,328,068 | 5/1982 | Curtis | 156/626 |
| 4,569,717 | 2/1986 | Ohgami et al. | 204/298.32 X |
| 4,676,883 | 6/1987 | Nelson et al. | 204/298.03 |
| 4,767,495 | 8/1988 | Nishioka | 204/298.32 X |
| 4,969,416 | 11/1990 | Schumaker et al. | 118/725 |
| 5,097,430 | 3/1992 | Birang | 364/572 |
| 5,169,478 | 12/1992 | Miyamoto et al. | 156/345 |
| 5,403,433 | 4/1995 | Morrison et al. | 204/192.33 X |

FOREIGN PATENT DOCUMENTS

| | | | |
|---|---|---|---|
| 116342 | 7/1982 | Japan | 216/60 |
| 62-20320 | 1/1987 | Japan . | |
| 3194989 | 8/1991 | Japan . | |
| 4177836 | 6/1992 | Japan . | |

OTHER PUBLICATIONS

IBM Technical Disclosure Bulletin vol. 34, No. 2 Jul. 1991.

*Primary Examiner*—Nam Nguyen
*Attorney, Agent, or Firm*—John J. Tomaszewski; DeLio & Peterson, LLC; Aziz M. Ahsan

[57] ABSTRACT

An ion milling end point detection method for etching coated substrates is disclosed comprising the use of a light measurement of light passing through a monitor substrate (e.g., glass coated with the same material at about the same thickness as the coated substrate to be etched) during the milling process, comparing the light values with a reference value and determining the end point of the milling process based on said values. Coated and uncoated monitor substrates may also be employed together and the values compared to determine the end point. An apparatus for determining the end point of an ion milling process is also disclosed.

19 Claims, 4 Drawing Sheets

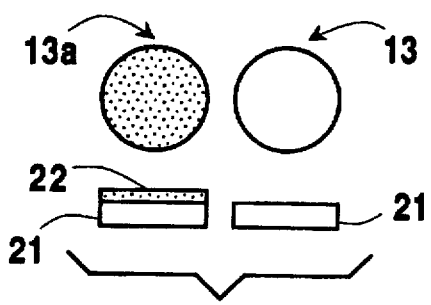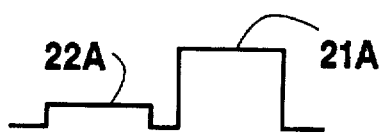
Fig. 3A
Fig. 3B
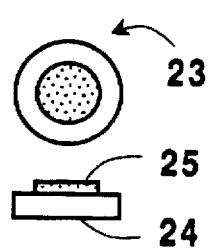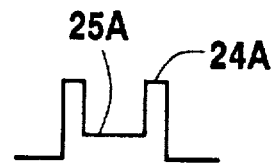
Fig. 4A
Fig. 4B
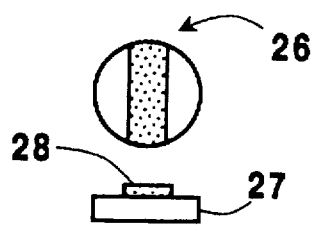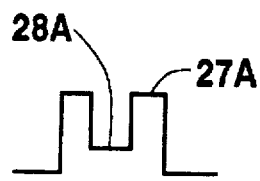
Fig. 5A
Fig. 5B
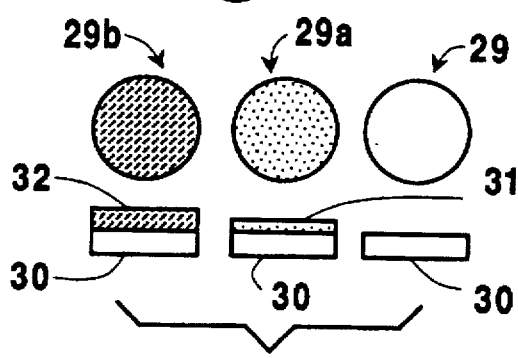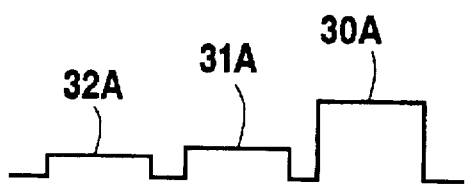
Fig. 6A
Fig. 6B

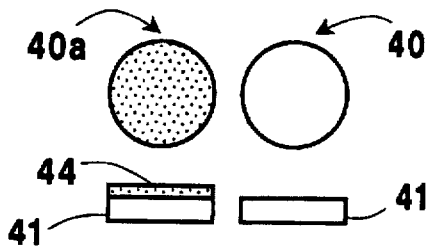
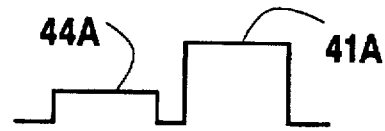
Fig. 11A     Fig. 11B
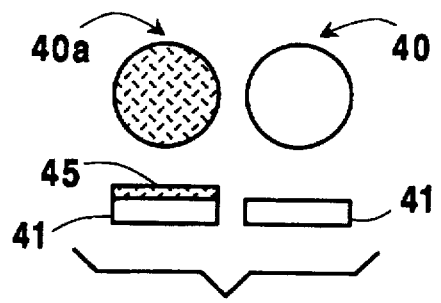
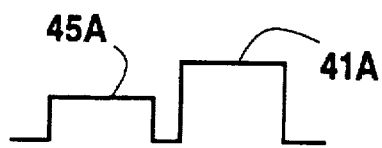
Fig. 12A     Fig. 12B
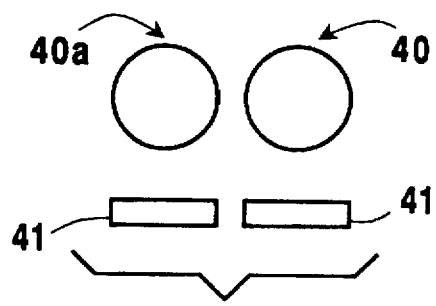
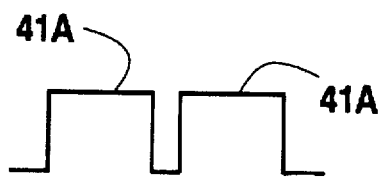
Fig. 13A     Fig. 13B

ION MILLING END POINT DETECTION METHOD AND APPARATUS

BACKGROUND OF THE INVENTION

1. Field of the Invention

This invention relates to plasma etching or ion milling of electronic components such as silicon semiconductor wafers and, in particular, to a detection method and apparatus for determining the end point of the milling process.

2. Description of Related Art

Ion milling is used in integrated circuit and thin film component fabrication to remove coatings either completely or partially from the component at various steps of the fabrication process. In general, the substrate having a coating to be removed such as a semiconductor wafer is placed in an vacuum chamber in which a gas is ionized to generate reactive ions. The removal of the coating is achieved by chemical reaction between the ions and the coating as well as by bombardment of the coating by the ions. The gaseous reaction products are continuously removed from the chamber by a vacuum pump. It will be understood that the terms ion milling, ion etching and plasma etching all relate to the same general process and may be used interchangeably.

In the production of MLC thin film products various materials are applied to the thin film metals primarily for the purpose for improving the adhesion of the subsequent application of thin polyimide films. One of these materials is chromium and when the polyimide films are removed to expose the metals for additional metalization process steps, the chromium and its associated chromium oxides must be removed since they are not desirable at the interface between the two layers of copper or other metals needed to fabricate the product.

For convenience the following description will be directed to chromium removal and the chromium may be removed by ion milling performed in a vacuum chamber using gases such as ionized argon. Basically, the chromium is bombarded and/or reacts with the ionized gas to form volatile components which are vaporized and removed during the process. The present method of determining the end point for removal of the chromium is to perform the process at a set of standard operating conditions for beam voltage, beam current, argon pressure, etc. for a calculated time period which assumes a certain ion milling rate. After the time period is elapsed, the etching process is stopped and the MLC products are removed from the vacuum chamber and microscopically inspected for chromium removal. This method is not very effective as can be appreciated and incomplete chromium removal necessitates the products being replaced in the chamber and the etching process continued. This is inefficient and costly. Over etching of the product is also a serious problem because the substrate is attacked and/or the etch mask may be undercut.

The end point of the ion milling process is defined herein as the point in the process where the desired amount of coating is removed. For most situations substantially complete removal is desired but for some other situations only a partial removal is needed and when this level of removal is reached that is the end point of the process.

One method for determining the ion milling rate is by calibration test runs with either chromium on silicon wafers or on glass disk monitors under a set of measured operating conditions. Measurements are made "ex situ" before and after a calibration test run and the amount of material removed is determined and the milling rate calculated by dividing the thickness of material removed by the milling time.

The ion etching equipment used to etch the substrate are basically vacuum chambers wherein the gas employed is ionized using an electrical source and means are provided to introduce the gas into the chamber and to remove gases from chamber. The substrates to be etched are positioned in the chamber and generally revolve around a central axis to uniformly expose the substrate surface.

A number of patents have been issued which have attempted to improve the etching process by using continuous detection methods where the end point is determined without having to start and stop the process repeatedly. U.S. Pat. No. 4,245,154 uses an optical fiberscope in the plasma reaction chamber to measure the intensity of the light in the chamber which is correlated to the plasma gas consumption. An increase in the light intensity signals the end point of the etching process. Another patent utilizing a light intensity measurement is U.S. Pat. No. 4,328,068 wherein a light pipe is positioned in the chamber such that light emitted by a component of the plasma and reflected from the surface of the substrate passes into the light pipe. U.S. Pat. No. 5,097,430 also measures light intensity within the chamber to signal the end point of the etching process. U.S. Pat. Nos. 4,969,416 and 5,169,478 show plasma etching reaction chambers. All the above patents are hereby incorporated by reference.

While the prior attempts to improve the etching process have advanced the art, increasing demands of industry necessitates end point detection methods which are more precise and reliable.

An object of this invention is to provide an ion milling end point detection method for use in the ion milling of substrates produced during electronic component manufacture.

Another object of the invention is to provide an ion milling apparatus for etching coated substrates made in electronic component manufacture.

Another object of the invention is to produce etched coated substrate articles by the method and/or apparatus of the invention.

Another object of the invention is to provide a deposition process end point detection method for use in deposition of coatings onto substrates made in electronic component manufacture.

Other objects and advantages will be readily apparent from the following description.

SUMMARY OF THE INVENTION

It has been discovered that the end point of an ion milling process for etching coated substrate products may be determined by a comparative light measurement of light passing through a light passing monitor substrate such as an uncoated monitor substrate (e.g., glass) and a coated monitor substrate (e.g., glass coated with preferably the same material on the substrate being etched at the same thickness) during the ion milling process. The end point for complete removal of the coating being determined typically when the light measurement values for both monitor substrates are the same. A single monitor having a coating thereon and/or having an uncoated and a coated part may suitably be used as described herein below.

A method is disclosed for determining the end point of an ion milling process for etching coated substrates, said method comprising:

positioning the coated substrate products in a vacuum chamber;

positioning in the vacuum chamber in preferably substantially the same orientation as the coated substrate products at least one light passing monitor substrate having a coating thereon and preferably the coating is on a portion thereof which coating is preferably the same material at substantially the same or greater thickness as on the coated substrate product to be etched;

positioning a light receiving lens within the chamber so that light passing through the monitor substrate is captured by the lens;

flowing a reaction gas into the chamber;

generating ions to etch the coated substrate product and the monitor substrates;

measuring the light passing through the monitor substrate and captured by the lens; and comparing the measured light values with each other if the monitor substrate is only partially coated or with a preset value or other light value to determine the end point of the process.

An ion milling apparatus of the invention comprises:

a vacuum chamber;

inlet means for introducing an ionizable gas into the chamber;

exhaust means for removing gases from the chamber;

means for forming ionized gases in the chamber;

means for holding a plurality of coated substrate products to be etched and at least one light passing monitor substrate having a coating thereon and preferably the coating is on at least a position thereof which coating is preferably the same material at preferably about the same or greater thickness as the coating to be etched from the coated substrate product;

light transmitting means, e.g., a cable, fiber optic cable, light pipe, etc., having first and second terminals, said first terminal penetrating a wall of the chamber and said second terminal being positioned at a location outside said chamber;

a lens attached to said first terminal and positioned to capture light passing through the monitor substrate; and measuring means connected to said second terminal to measure the light passing through the monitor substrate and determining the amount of coating remaining on the monitor substrate based on the light measurement values.

BRIEF DESCRIPTION OF THE DRAWINGS

For a fuller understanding of the invention, reference should be made to the following description taken in conjunction with the accompanying drawings, in which:

FIGS. 3A-8A show various monitor substrates in top views and in elevational views, below each top view.

FIGS. 3B-8B show graphical representations if the amount of light passing through the monitor substrates in each of corresponding FIGS. 3A-8A, respectively.

FIGS. 9A-13A each show a pair of monitor substrates in top views and in elevational views, below each top view.

FIGS. 9B-13B show graphical representations of the amount of light passing through the monitor substrates in each of corresponding FIGS. 9A-13A, respectively.

DESCRIPTION OF THE PREFERRED EMBODIMENTS

The ion milling apparatus of the invention are basically vacuum chambers into which a gas to be ionized is fed and the ionized gas and other gases and volatiles generated driving the process are evacuated during the process. A number of substrates to be etched are positioned therein. During the process, the gas is ionized and the ionized gas bombards and/or reacts with the coating on the substrate producing a volatile material which is evacuated from the chamber. While any conventional ion milling apparatus may be employed, the following description will directed for convenience to a vacuum chamber with a dome-shaped products retainer as shown in the figures. It is highly preferred that the coated substrates to be etched be positioned in the apparatus so that the coated substrate products and the light monitor substrate or substrates be exposed to essentially the same ion milling conditions and that the ion source be positioned so that the generated ions are directed at the surface of the substrates. It is important that the monitor substrates be in essentially the same optical light path to each other.

Figure 1:
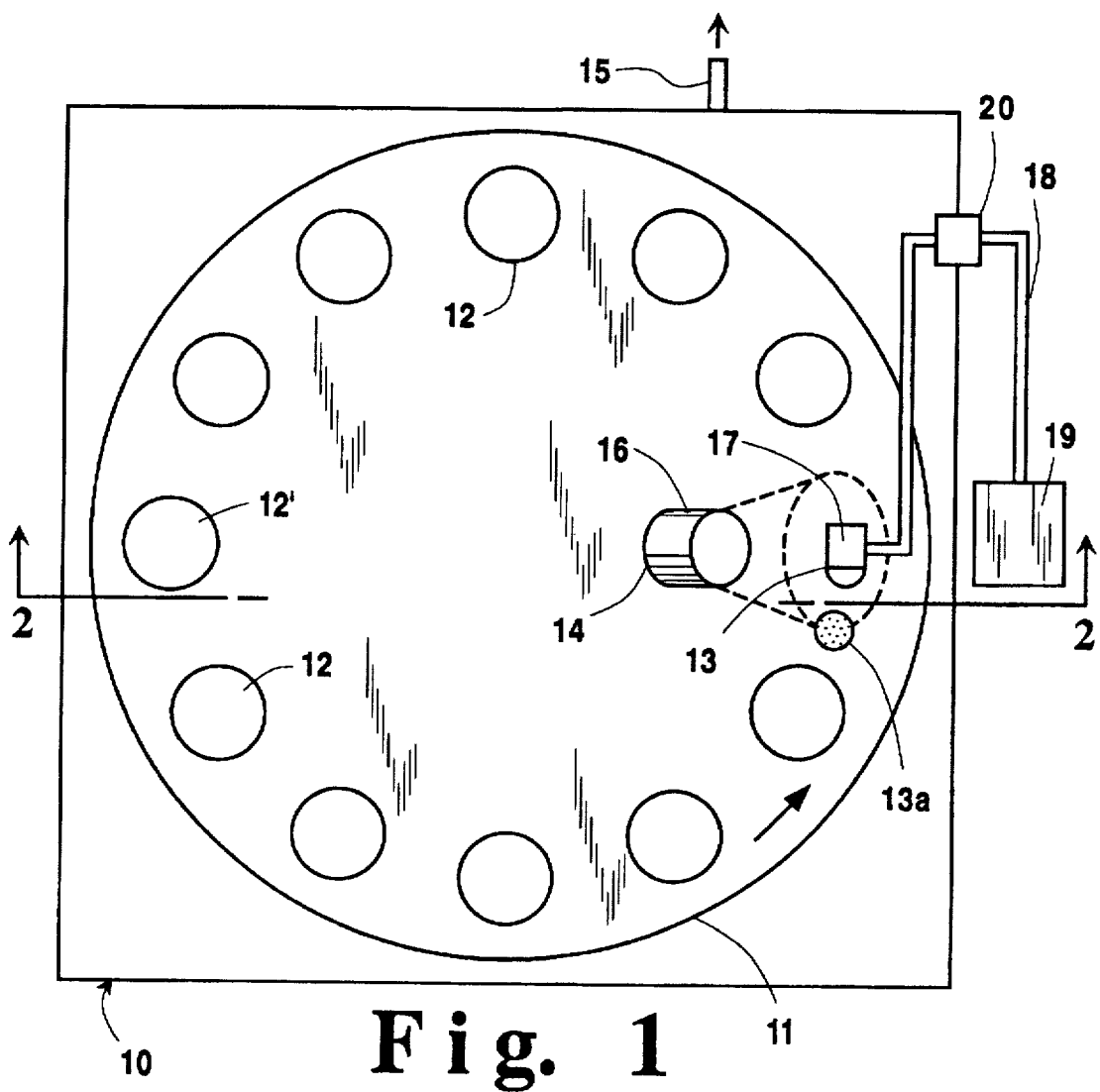
FIG. 1 is a schematic illustration of a top view of an ioning milling vacuum chamber apparatus having a lens mounted therein.
Figure 2:
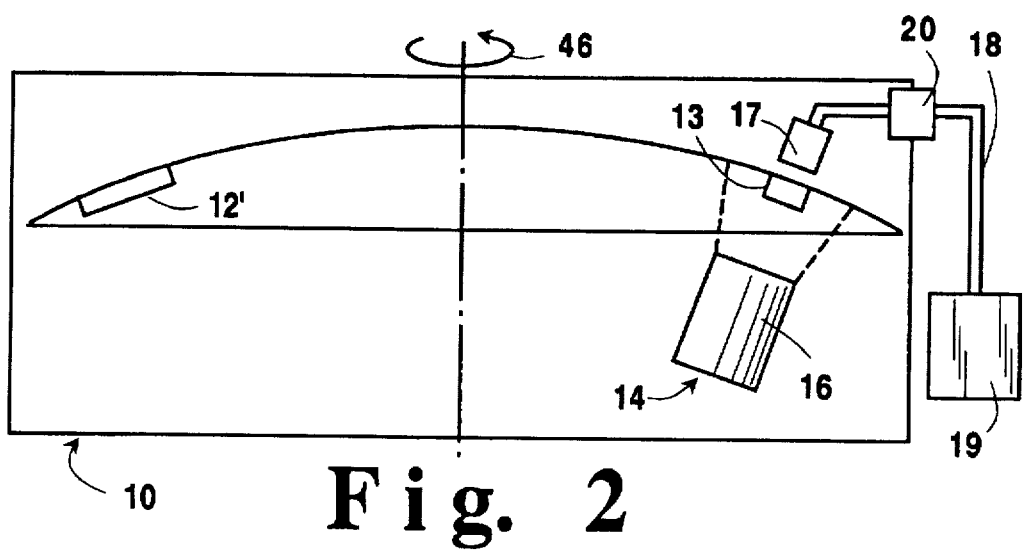
FIG. 2 is a schematic illustration of a side view of the vacuum chamber apparatus of FIG. 1 along lines 2—2.

With regard to FIG. 1, a vacuum chamber is shown as 10. A rotating dome-shaped product retainer 11 is shown containing a number of coated substrate products 12 which are to be etched. The coated substrates are positioned around the periphery of the dome as shown in FIG. 2. Coated substrate 12' is the same as coated substrate 12 but is distinguished for clarification purposes in FIG. 2 as described herein below. Monitor substrates 13 and 13a are shown positioned similarly to coated substrates 12 and both the coated substrate products 12 and monitor substrates 13 and 13a revolve around a central axis as shown by the arrow 46 in FIG. 2. A usual speed of travel is about 12 rpm. Monitor substrate 13a has a coating thereon which is the same material and thickness as on the coated substrates 12. A gas inlet 14 and gas outlet 15 are provided. The gas inlet 14 is connected to ion source 16. Ion source 16 generates ions for etching and is shown radially directed at lens 17 so that the generated ions are radially directed at coated substrates 12 and monitor substrates 13 and 13a. A light source (e.g., hot filament) may also be employed with ion source 16 to produce additional light. The lens 17 is attached to cable 18 which is connected to light measuring means 19. Cable 18 penetrates the vacuum chamber at point 20 and the seal at this point is a vacuum seal and forms a vacuum seal and feed through 20. Cable 18 is preferably a fiber optic cable used for processing/transporting the light captured by lens 17 and is generally shielded to protect from, e.g., electro-magnetic interference. Lens 17 may also be a self contained light capturing and light measuring device which can be programmed to determined the end point of the process as discussed herein.

As can be seen in FIGS. 1 and 2, the ion and light source 16 is directed at and bombards the coated substrates 12 and monitor substrates 13 and 13a and light passing through 13 and 13a would be captured by the lens 17. No light can pass through substrates 12. Light collected in the lens 17 passing through 13a can be measured and compared with a preset and/or reference value or compared with the light passing through uncoated monitor substrate 13 to determine the end point of the process. FIGS. 1 and 2 show two monitor substrates 13 and 13a which are used to determine the end point of the etching process which in this case is substantially complete removal of the coating. Thus, monitor substrate 13a is coated with the same material coated on coated substrate 12 at substantially the same thickness and as it revolves in the vacuum chamber, the coating on the monitor substrate 13a is etched in the same manner as the coating is etched on the coated substrate 12. Initially, none or little light will be transmitted through monitor substrate 13a and no light therefore measured by light measuring means 19. Monitor 13 however, is an uncoated monitor substrate which when in the path of the ion and light source 16 will transmit light captured by lens 17 and measured by light measuring means 19. As the process proceeds, the coating on monitor substrate 13a, which is being continuously etched, will begin to transmit more light which light will be measured and compared to the transmission of light by monitor substrate 13. At the point when the light transmitted is essentially the same through 13 and 13a this will indicate that the material has been etched to its desired level and the end point of the etching process has been reached.

FIG. 2 shows in a side view the transparent substrate 13 between the ion and light source 16 and lens 17 with the light from the ion and light source being radially directed at 13 and captured by lens 17. For clarity, only coated substrate 12' and monitor substrate 13 are shown on the figure.

In a preferred method of operation, monitor substrates 13 and 13a are placed in proximity. As the dome rotates, light is blocked from lens 17 until uncoated monitor 13 passes the light and ion source 16 and light is transmitted to lens 17. When the light intensity exceeds a predetermined threshold, a light value is stored and a timer is activated. At a second preset time, corresponding to the lens viewing the central portion of coated monitor 13a, a second light value is stored. This process is repeated until the light passing through monitor substrates 13 and 13a are the same intensity.

The ion source 16 is the central source of argon ions and ionizes the gas by use of an Ionizer or high electric fields. In general, an Ionizer induces ionization with electrons from the hot filament light source with energies greater than the ionization potential of the gas, which electrons collide with gas atom molecules and ionize the gas. Other gases, for example, which may be used include nitrogen, oxygen, ammonia, $C_2F_6$, helium and neon. The ion source is preferably complimented with a white hot neutralizing filament which provides a source of neutralizing electrons for the process. Both the ion source 16 and the neutralizing filament are sources of light radiation which would be captured by lens 17. As shown in FIGS. 1 and 2, the lens 17 is positioned above the dome radially from the ion and light source 16 with the coated substrates 12 and monitor substrates 13 and 13a being positioned therebetween. The lens 17 is focused to receive a cone of ionized gas light and neutralizing filament light passing through the monitor substrate into the lens 17 and is conducted by cable 18 (preferably fiber optic) to the light measuring means 19 to provide a light measurement value and end-point determination.

FIGS. 3A and 3B show the two monitor substrates 13 and 13a utilized in FIGS. 1 and 2. Monitor substrate 13 has a substrate 21 of glass so that all of the light shining on it passes through the substrate and the amount of light passing is shown as height 21A in FIG. 3B. Monitor substrate 13a also has a substrate 21 and coating 22 which is of a coating thickness equal to the coating on coated substrate 12. The amount of light passing through 13a is shown as height 22A in FIG. 3B.

Figure 9A:
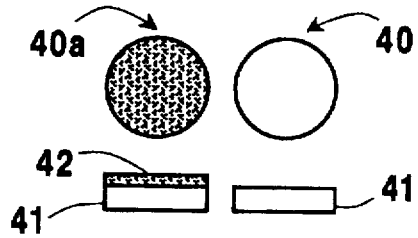
Figure 9B:
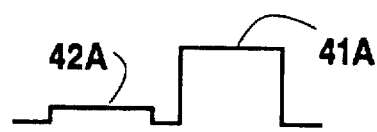
Figure 10A:
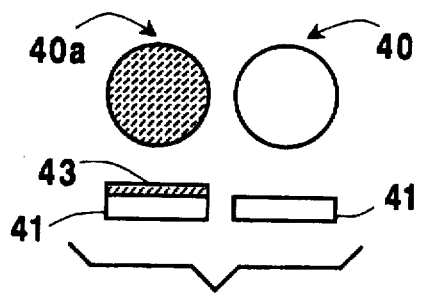
Figure 10B:
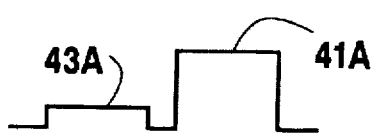

With reference to FIGS. 9A–13A and 9B–13B, these figures show the progression of the etching of a monitor substrate during the etching process represented at the start by FIGS. 9A and 9B and the end of the process being represented by FIGS. 13A and 13B. Thus, FIG. 9A shows two (2) monitor substrates. Monitor substrate 40 is an uncoated monitor substrate having a base 41 and monitor substrate 40a has a base 41 and a coating 42. The coating 42 is substantially the same coating and the same thickness as the coating to be etched from a product substrate. FIG. 9B shows the amount of light transmission through monitor substrate 40 represented as height 41A whereas the amount of light transmission through coated monitor substrate 40a is shown as height 42A. As the etching process continues FIGS. 10A and 10B show that some of the coating is removed from the monitor substrate 40a and the coating now has a thickness shown as 43. In FIG. 10B the amount light transmission through uncoated monitor disk 40 is represented as height 41A whereas the amount of light transmission through coated monitor substrate 40a is shown as height 43A. In FIGS. 11A and 11B more of the coating has been etched and the amount of coating remaining on monitor substrate 40a is now shown as 44 and in FIG. 11B the amount of light transmission through coated monitor substrate 40a is shown as height 44A. In FIGS. 12A and 12B more of the coating is shown removed and the amount of coating left on coated monitor disk 40a is shown as 45 and the amount of light transmission through monitor substrate disk 40a is shown as height 45A in FIG. 12B. It can seen that the amount of light transmission through coated monitor substrate disk 40a increases as the etching process continues with the amount of light as represented by the height of the graphics in FIGS. 9B–13B becoming closer to the amount of light passing through uncoated monitor substrate 40 as shown by height 41A. At the end of the process FIGS. 13A and 13B show that no coating is left on coated monitor substrate 40a and that the amount of light transmission as shown in FIG. 13B is the same for both monitor substrates 40 and 40a as represented by equal heights 41A of FIG. 13B.

In an ion milling process where it is desired that not all of the coating is removed, reference to FIGS. 9A–13A and 9B–13B shows that any level of removal can be accomplished using the method of the invention. Thus, if a coating removal equal to that shown in FIG. 12A is desired, the end point would be the point at which the level of light transmission is equal to height 45a in FIG. 12B. Accordingly, the process can be used for any level of coating removal from substantially none to substantially complete removal.

With reference to FIGS. 4A and 4B, a partially coated monitor substrate 23 has a light passing substrate 24 and a partial coating 25 thereon. The amount of light passing through monitor 23 is shown in FIG. 4B with the height shown as 24A indicating the amount of light passing through the uncoated portion 24 of monitor 23 and the height 25A indicating the amount of light passing through the coated portion 25 of monitor 23. In FIGS. 5A and 5B another partially coated monitor substrate 26 has a light passing base 27 and a coating 28. In FIG. 5B the amount of light passing through the uncoated portion 27 of monitor 26 is indicated by height 27A whereas the amount of light passing through the coated portion 28 is indicated by height 28A. In FIGS. 6A and 6B three (3) monitor substrates 29, 29a and 29b are shown. Monitor 29 has an uncoated base 30, monitor 29a has a thin coating 31 on substrate base 30 and monitor substrate 29b has a thicker coating 32 on base 30. The amount of light transmission through each of the substrates is shown in FIG. 6B where the amount of light passing through the uncoated substrate 30 is indicated as height 30A, the light passing through substrate 29a which has thin coating 31 thereon is shown as height 31A and height 32A indicating the amount of light passing through substrate 29b.

Figure 7A:
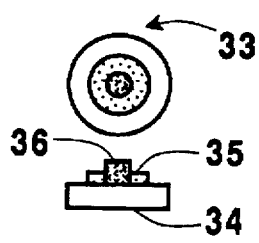
Figure 7B:
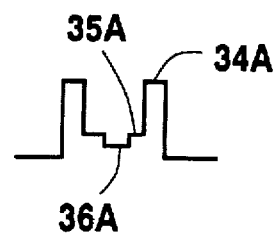
Figure 8A:
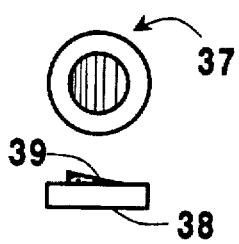
Figure 8B:
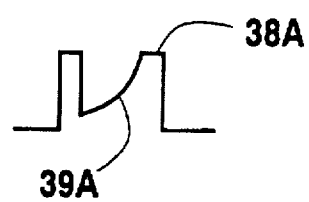

It can seen that the least light is transmitted through monitor 29b which has the thickest coating 32. In FIGS. 7A and 7B a single monitor substrate 33 is shown having a base 34, a thin coating 35 and a thicker center coating 36. The amount of light transmission through the uncoated portion of 34 is shown as height 34A in FIG. 7B, the amount of light passing through the portion coated with coating 35 is shown as height 35A and the amount of light passing through the thickest coating 36 is shown as height 36A. In FIGS. 8A and 8B a monitor substrate 37 is shown having a base 38 with an angular central coating 39. In FIG. 8B the amount of light passing through uncoated base 38 is shown as height 38A and the amount of light passing through the angular coating 39 is shown as height 39A.

Typically, the light transmission to coating thickness relationship is logarithmic in nature (Beer-Lambert Law) and for chromium films the knee of the curve is about 100 to 300 Angstroms at 11% to 1.5% light transmission, respectively. The dark range is 300 Angstroms and thicker at 1.5% transmission and lower. The clear range is 0 to 100 Angstroms from 100% to 11% light transmission, respectively. Depending on the coating to be removed, as will be appreciated by those skilled in the art, mathematical correlation's can be formulated and used to calculate the thickness of coating remaining on the substrate by the measured light transmission. Further, calibration curves of % light transmission versus film thickness can be generated for particular materials and used to determine the film thickness during the etching process. Such a technique is shown in IBM Technical Disclosure Bulletin, Volume 34, No. 2, July 1991, which is hereby incorporated by reference. In general, the calibration curves are established by correlating film thickness (measured independently by X-ray fluorescence) and % light transmission for a number of coated monitor substrates. Broadband visible light is generally used for metallic films since metallic films have no sharp absorption bands in the visible region. On this point it will also be appreciated that a single coated monitor substrate may be employed with the desired thickness end point being determined by the % light transmission value as compared to say using two monitor substrates (coated and uncoated) as described hereinabove.

Another benefit of the invention is that the etching rate of the process can be determined by calculating the thickness of the coating removed based on the % light transmission values and using this value and the elapsed time to calculate the etching rate. This rate value is very important in some processes since it provides a feedback value which can be used to control the parameters of the etching process to achieve the desired process conditions. For example, for some etching processes a slower etching rate is desired so that enhanced control of the process can be achieved.

While the above description has been directed to an ion milling process it will be readily apparent to those skilled in the art that the process can also be employed to control a coating deposition process wherein a coating is applied to substrate until a desired coating thickness level (end point) is reached. The process is essentially the reverse of the ion milling process except that the light transmission passing through the monitor substrate decreases instead of increasing over time. The mathematical correlation's, calibration curves and measuring methods remain the same. The only significant difference being that for most situations only one monitor substrate is needed. For example, a clear uncoated glass monitor substrate is placed in the deposition chamber along with uncoated substrates to be coated. Any conventional deposition chamber can be employed. Initially, the clear glass monitor substrate passes 100% light transmission but as the process proceeds, the % light transmission decreases until the desired end point is reached, which can be determined in a number of ways as will be appreciated by those skilled in the art. One method being the use of calibration curves and another being measuring the % light transmission through a known thickness coated monitor substrate and comparing the values obtained during the process with that value until the % light transmission values are equal.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

While the invention has been illustrated and described in what are considered to be the most practical and preferred embodiments, it will be recognized that many variations are possible and come within the scope thereof, the appended claims therefore being entitled to a full range of equivalents.

Thus, having described the invention, what is claimed is:

1. An end point detection method for an ion milling process for etching coated substrates which process is performed in an ion milling apparatus wherein an ion source generates light and ions for milling and the ions bombard the coated substrates comprises positioning a light passing monitor substrate in the apparatus in substantially the same orientation as the coated substrates being etched, the monitor substrate comprising a light passing substrate having a coating on at least a position thereof of the same material as on the coated substrate, measuring the light passing through the light passing monitor substrate, comparing the measured light values passing through the monitor substrate during the process with a preset reference value or reference value based on the uncoated monitor substrate and determining the end point of the milling process based on said values.

2. The method of claim 1 wherein the reference value is a value which indicates substantially complete removal of the coating.

3. The method of claim 1 wherein the reference value is a value which indicates partial removal of the coating.

4. The method of claim 1 wherein the etching rate can be calculated from the measured light values and elapsed etching time, which rate is then used to control the etching process.

5. The method of claim 1 wherein at least two monitor substrates are employed, one being uncoated and the other being coated with the same material as on the coated substrate to be etched at essentially the same thickness.

6. The method of claim 5 wherein the end point is determined when the light values passing through the uncoated and coated monitor substrates are the same.

7. The method of claim 1 wherein a single partially coated monitor substrate is used.

8. The method of claim 1 wherein the ions generated by the ion source are directed radially at the monitor substrate.

9. A method for determining the endpoint of an ion milling process for etching coated substrates, said method comprising:

positioning the coated substrates in a vacuum chamber;

positioning in the vacuum chamber in substantially the same orientation as the coated substrate products at least one light passing monitor substrate comprising a light passing substrate having a coating on at least a portion thereof of the same material as on the coated substrate;

positioning a light receiving lens within the chamber so that light passing through the monitor substrate is captured by the lens;

flowing a reaction gas into the chamber;

generating ions to etch the substrates and produce light which ions bombard the coated substrates and monitor substrate;

measuring the light passing through the monitor substrate; and comparing the measured light value with a preset reference value or reference value based on the uncoated monitor substrate to determine the end point of the process.

10. The method of claim 9 wherein the coating on the monitor substrate is the same material at substantially the same thickness as on the coated substrate to be etched.

11. The method of claim 9 wherein two monitor substrates are employed, one being uncoated and the other being coated with the same material on the coated substrate to be etched at essentially the same thickness.

12. The method of claim 9 wherein the reference value is a value which indicates substantially complete removal of the coating.

13. The method of claim 9 wherein the reference value is a value which indicates partial removal of the coating.

14. The method of claim 9 wherein the generated ions are directed radially at the monitor substrate.

15. An ion milling apparatus comprising:

a vacuum chamber;

inlet means for introducing an ionizable gas into the chamber;

exhaust means for removing gases from the chamber;

means for forming ionized gases in the chamber which ions produce light and which bombard coated substrates in the chamber;

means for holding in substantially the same orientation in the chamber a plurality of coated substrate products to be etched and at least one light passing monitor substrate comprising a light passing substrate having a coating on at least a portion thereon of the same material as on the coated substrate;

light transmitting means having first and second terminals said first terminal penetrating a wall of the chamber and said second terminal being positioned at a location outside said chamber;

a lens attached to said first terminal and positioned to capture light passing through the monitor substrate; and measuring means connected to said second terminal to measure the light passing through the monitor substrate and to determine the amount of coating remaining on the monitor substrate based on the light measurement values and a preset reference value or reference value based on the uncoated monitor substrate.

16. The apparatus of claim 15 which is a dome shape product holder in a vacuum chamber.

17. The apparatus of claim 15 wherein at least two monitor substrates are employed, with at least one being uncoated and at least one being coated with the same material at essentially the same thickness as the coated substrate to be etched.

18. The apparatus of claim 17 wherein the two monitor substrates are positioned in the same optical light path passing through the monitor substrates.

19. The apparatus of claim 15 wherein the means for forming ionized gases is directed radially at the monitor substrate.

* * * * *